US009600420B2

(12) United States Patent
Oportus Valenzuela et al.

(10) Patent No.: US 9,600,420 B2
(45) Date of Patent: Mar. 21, 2017

(54) REDUCING DECOMPRESSION TIME WITHOUT IMPACTING COMPRESSION RATIO

(71) Applicant: QUALCOMM Incorporated, San Diego, CA (US)

(72) Inventors: Andres Alejandro Oportus Valenzuela, San Diego, CA (US); Richard Senior, San Diego, CA (US); Raghuveer Raghavendra, San Diego, CA (US); Nieyan Geng, San Diego, CA (US); Gurvinder Singh Chhabra, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 199 days.

(21) Appl. No.: 14/526,868

(22) Filed: Oct. 29, 2014

(65) Prior Publication Data

US 2016/0124867 A1 May 5, 2016

(51) Int. Cl.
G06F 12/00 (2006.01)
G06F 12/12 (2016.01)
(Continued)

(52) U.S. Cl.
CPC .......... G06F 12/12 (2013.01); G06F 12/1009 (2013.01); H03M 7/30 (2013.01);
(Continued)

(58) Field of Classification Search
CPC ...... G06F 12/12; G06F 12/1009; G06F 12/08; G06F 2212/401; G06F 2212/69; H03M 7/6017; H03M 7/30
See application file for complete search history.

(56) References Cited

U.S. PATENT DOCUMENTS 5,864,859 A 1/1999 Franaszek
5,940,871 A * 8/1999 Goyal .................. G06F 9/3017
711/102
(Continued)

FOREIGN PATENT DOCUMENTS

EP 2487583 A1 8/2012
GB 2319865 A 6/1998

OTHER PUBLICATIONS

Ekman M., et al., "A Robust Main-Memory Compression Scheme," Jun. 8, 2005 (Jun. 8, 2005), XP055240090, Retrieved from the Internet: URL: http://pages.cs.wisc.edu/isca2005/papers/02B-01.PDF.
(Continued)

Primary Examiner — John A Lane
(74) Attorney, Agent, or Firm — The Marbury Law Group, PLLC

(57) ABSTRACT

Aspects include computing devices, systems, and methods for implementing executing decompression of a compressed page. A computing device may determine a decompression block of a compressed page that contains a code instruction requested in a memory access request. Decompression blocks, other than the decompression block containing the requested code instruction, may be selected for decompression based on being situated between an end of the compressed page and the decompression block containing the requested code instruction. Decompression blocks not identified for decompression may be substituted for a fault or exception code. The computing device may decompress decompression blocks identified for decompression, starting at the end of the compressed page and terminating the decompression of the compressed page upon filling all blocks with decompressed blocks, faults, or exception code. The remaining decompression blocks of the compressed
(Continued)

page may be decompressed after or concurrently with the execution of the requested code instruction.

30 Claims, 9 Drawing Sheets

(51) Int. Cl.
  *G06F 12/10* (2016.01)
  *H03M 7/30* (2006.01)
  *G06F 12/08* (2016.01)
(52) U.S. Cl.
  CPC ......... *H03M 7/6017* (2013.01); *H03M 7/702* (2013.01); *G06F 12/08* (2013.01); *G06F 2212/401* (2013.01); *G06F 2212/69* (2013.01); *H03M 7/6023* (2013.01)

(56) References Cited

U.S. PATENT DOCUMENTS

| | | | |
|---|---|---|---|
| 6,522,268 | B2 | 2/2003 | Belu |
| 7,987,162 | B2 | 7/2011 | Aston et al. |
| 8,131,918 | B2 | 3/2012 | Cho |
| 2010/0223237 | A1 | 9/2010 | Mishra et al. |
| 2010/0325523 | A1 | 12/2010 | Slyz et al. |
| 2012/0131320 | A1 | 5/2012 | Park et al. |
| 2013/0204851 | A1 | 8/2013 | Bhola et al. |
| 2014/0195499 | A1 | 7/2014 | Amit et al. |
| 2014/0223029 | A1* | 8/2014 | Bhaskar .............. H03M 7/3088 709/247 |
| 2015/0195553 | A1* | 7/2015 | Tamatani ............... H04N 19/91 382/233 |
| 2015/0381203 | A1* | 12/2015 | Master ................... H03M 7/46 341/67 |
| 2016/0124659 | A1 | 5/2016 | Oportus Valenzuela |

OTHER PUBLICATIONS

Burrows M., et al., "On-line Data Compression in a Log-structured File System," Proceedings of the fifth international conference on Architectural support for programming languages and operating systems, 1992, ACM, pp. 2-8.

Ozturk O., et al., "Access Pattern-Based Code Compression for Memory-Constrained Embedded Systems," IEEE Proceedings of the Design, Automation and Test in Europe Conference and Exhibition, Mar. 2005, vol. 2, pp. 882-887.

Wynn A., et al., "The effect of compression on performance in a demand paging operating system," The Journal of Systems and Software, 2000, vol. 50, pp. 151-170.

International Search Report and Written Opinion—PCT/US20151048315—ISAEPO—Jan. 22, 2016.

International Search Report and Written Opinion—PCT/US2015/048330—ISA/EPO—Jan. 22, 2016.

* cited by examiner

REDUCING DECOMPRESSION TIME WITHOUT IMPACTING COMPRESSION RATIO

RELATED APPLICATIONS

This application is related to U.S. patent application Ser. No. 14/526,850 entitled Efficient Decompression Locality System For Demand Paging, which is filed concurrently herewith.

BACKGROUND

In computer operating systems, demand paging (as opposed to anticipatory paging) is a method of virtual memory management. In a system that uses demand paging, the operating system copies a disk page into physical memory only if an executing processes makes an attempt to access the page and that page is not already in memory (i.e., if a page fault/miss occurs). Pages demanded by the process are retrieved from secondary storage and loaded to main memory. By loading pages that are demanded by the executing process, less loading latency occurs at program startup, as less information is accessed from secondary storage and less information is brought into main memory. Further, as main memory is expensive compared to secondary memory, this technique reduces the amount of main memory needed, reducing the component costs of smart phones for example.

Pages stored in the secondary memory may be of a certain size, and requesting a page from the secondary memory means transmitting the page of the certain size to the main memory. This transfer requires the use of resources, such as data bus bandwidth and power. To reduce the use of such resources, pages comprising an entire compression block may be compressed prior to being copied to the main memory. The compression reduces the size of the page, thus reducing the resources required to load the compressed page to memory.

However, the decompression time of each page received at the main memory creates a performance bottleneck. Pages may be received by the main memory faster than the pages can be decompressed and the instructions or data in the page can be used. Some of the decompression work is done for pages containing code or data that won't be used, further delaying the use of the other instructions and data.

Further, efficient compression algorithms often employ lookbacks, which allow for patterns of previously compressed data to be used to more efficiently compress and decompress remaining data. However, compression algorithms independently compress blocks of data. As the block size gets smaller, there are fewer lookback opportunities and hence the compression ratio degrades.

SUMMARY

The methods and apparatuses of various aspects provide circuits and methods for executing decompression of a compressed page on a computing device. An aspect method may include determining a first decompression block of the compressed page containing a code instruction requested in a memory access request, substituting a second decompression block of the compressed page with an exception code, decompressing the compressed page starting at a first end of the compressed page, and terminating decompression of the compressed page in response to completing decompression of the first decompression block.

An aspect method may further include building a local dictionary of patterns of compressed information of the compressed page related to decompressed information resulting from decompressing the compressed page, and using the local dictionary to decompress compressed information of the compressed page.

In an aspect, decompressing the compressed page starting at a first end of the compressed page may include decompressing the first decompression block.

An aspect method may further include determining decompression block boundaries of a plurality of decompression blocks of the compressed page, and generating decompression block boundary metadata associated with the compressed page indicating the decompression block boundaries for each of the plurality of decompression blocks.

An aspect method may further include executing the code instruction after terminating decompression of the compressed page, and decompressing the second decompression block after terminating decompression of the compressed page.

In an aspect, decompressing the second decompression block after terminating decompression of the compressed page may include decompressing the second decompression block after executing the code instruction.

In an aspect, decompressing the second decompression block after terminating decompression of the compressed page and executing the code instruction after terminating decompression of the compressed page may include executing the code instruction and decompressing the second decompression block time sliced with each other.

An aspect method may further include scheduling executing the code instruction on a first processor core, scheduling decompressing the second decompression block on a second processor core, and scheduling executing the code instruction and decompressing the second decompression block to execute in parallel.

An aspect includes a computing device having a processor, a memory device communicatively connected to the processor and configured to store code instructions, and a decompression engine communicatively connected to the processor and the memory device and configured to perform operations of one or more of the aspect methods described above.

An aspect includes a non-transitory processor-readable medium having stored thereon processor-executable software instructions to cause a processor to perform operations of one or more of the aspect methods described above.

An aspect includes a computing device having means for performing functions of one or more of the aspect methods described above.

BRIEF DESCRIPTION OF THE DRAWINGS

The accompanying drawings, which are incorporated herein and constitute part of this specification, illustrate example aspects of the invention, and together with the general description given above and the detailed description given below, serve to explain the features of the invention.

DETAILED DESCRIPTION

Figure 1:
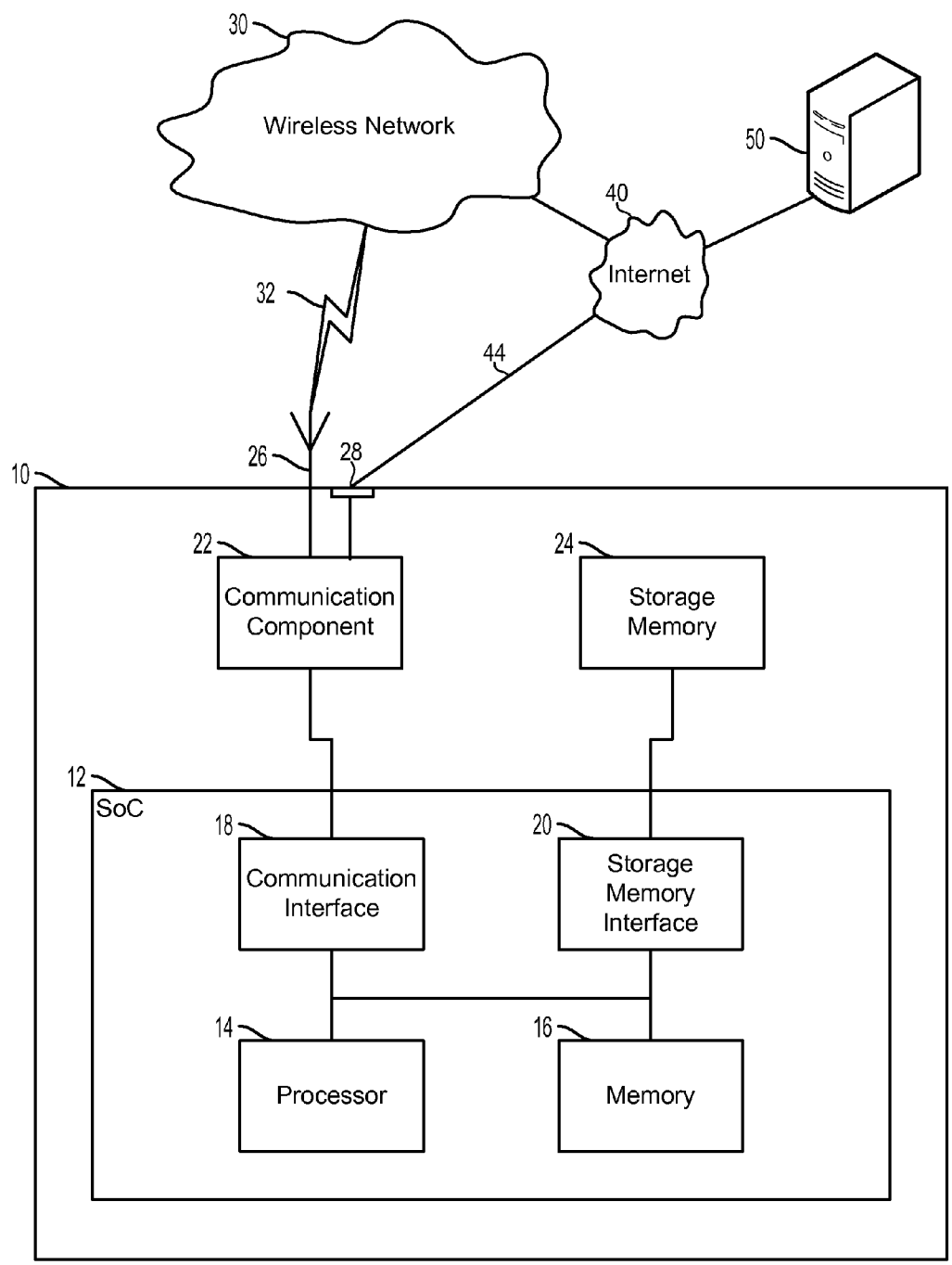
FIG. 1 is a component block diagram illustrating a computing device suitable for implementing an aspect.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The terms "computing device" and "mobile computing device" are used interchangeably herein to refer to any one or all of cellular telephones, smartphones, personal or mobile multi-media players, personal data assistants (PDA's), laptop computers, tablet computers, smartbooks, ultrabooks, palm-top computers, wireless electronic mail receivers, multimedia Internet enabled cellular telephones, wireless gaming controllers, and similar personal electronic devices that include a memory, and a multi-core programmable processor. While the various aspects are particularly useful for mobile computing devices, such as smartphones, which have limited memory and battery resources, the aspects are generally useful in any electronic device that implements a plurality of memory devices and a limited power budget in which reducing the power consumption of the processors can extend the battery-operating time of the mobile computing device.

The term "system-on-chip" (SoC) is used herein to refer to a set of interconnected electronic circuits typically, but not exclusively, including a hardware core, a memory, and a communication interface. A hardware core may include a variety of different types of processors, such as a general purpose processor, a central processing unit (CPU), a digital signal processor (DSP), a graphics processing unit (GPU), an accelerated processing unit (APU), an auxiliary processor, a single-core processor, and a multi-core processor. A hardware core may further embody other hardware and hardware combinations, such as a field programmable gate array (FPGA), an application-specific integrated circuit (ASCI), other programmable logic device, discrete gate logic, transistor logic, performance monitoring hardware, watchdog hardware, and time references. Integrated circuits may be configured such that the components of the integrated circuit reside on a single piece of semiconductor material, such as silicon.

Aspects include methods and computing devices implementing such methods for decoupling a page size from a decompression block size resulting in smaller decompression blocks by indicating the locations of various instructions in the compressed page, decompressing portions of the page including instructions by generating an exception to end decompression of the page based on the indications, and decompressing the remainder of the page at a later time.

Instructions stored in a storage memory may be grouped together in a page and transferred to a main memory for execution. As discussed above, the page containing the instructions may be compressed. However, when compressing the page, the contents of the page may be designated as smaller individual decompression blocks. As a result of compressing the contents of the page, the page contains a smaller amount of data than if compressing each instruction individually or in smaller groups, and becomes a compressed page. As part of compressing the page containing the instructions, metadata may be generated to indicate the location of the decompression blocks within the page. The metadata may be used to define encoded borders for indicating the smaller decompression blocks within the compressed page, including indicating where to end decompression of the smaller decompression blocks within the compressed page. The metadata may be stored in a table accessible during the decompression of the compressed page. Architectures of different processing devices may allow for only uniform length instructions, or also variable length instructions. For uniform length instructions, the metadata may be generated to create arbitrary borders that encompass one or more entire instructions within a decompression block. For variable length instructions that metadata may be generated to encompass one or more variable length instructions depending on the sizes of the variable length instructions.

The compressed page, comprised of multiple independent decompression blocks, received in the main memory may be decompressed so that its contents, particularly instructions, may be accessed and executed. Decompression of the compressed page may be interrupted by an exception generated when one or more decompression blocks of the compressed page are decompressed. The exception may be generated based on decompressing the compressed page until the decompression process reaches the end of one of the decompression blocks, or borders indicated by the metadata. The decompression block may be associated with an instruction in the compressed page designated for execution. The exception may be triggered by populating the remainder of the compressed page with an instruction or data that will trigger the exception causing the decompression of the page to terminate. The decompressed portion of the page may then be executed. The exception may further trigger the remainder of the page to be decompressed at a later time, such as after the execution of the instructions in the decompressed portion of the page. In an aspect, the exception may trigger the remainder of the compressed page to be decompressed in a time sliced manner with execution of the decompressed instruction on a processor core. In an aspect, either the decompressed instructions or the remainder of the compressed page may be migrated to be executed or decompressed on another processor core in parallel with the other of the execution or decompression.

Being able to execute instructions from a compressed page before completing the decompression of the page allows for the progression of a program without having to wait for the full page to be decompressed. The time required to decompress the remainder of the compressed page may be shifted to a later time, such as after sufficient progression of the program, reducing the delay in executing the instructions for progressing the program. In an aspect, similar delay reductions may be accomplished by time slicing the execution of the instruction with the decompression of the remainder of the compressed page, or executing the instruction and decompressing the remainder of the page in parallel.

Aspects include methods and computing devices implementing such methods for compressing multiple decompression blocks of code instructions together thereby enabling lookback opportunities across the multiple decompression blocks. The decompression of the multiple decompression blocks may take advantage of the efficiencies of the compression afforded by the lookback opportunities by decompressing from either end of the group of the decompression blocks.

As above, in compressing the page, smaller decompression blocks may be designated within the page individually based on their decompression block boundaries. As the contents of the designated decompression blocks within the page may be compressed together, rather than individually, the compression may implement lookbacks across the multiple decompression blocks. Although the contents of the page may be compressed together based on the page boundaries, the decompression blocks may maintain their decompression block boundaries according to the generated metadata.

The compressed page received in the main memory may be decompressed so that its contents, such as instructions, may be accessed and executed. Decompression of the compressed page may begin at either end of the compressed page to take advantage of the efficiencies provided by compressing the page using lookbacks. For example, if a decompression block from the middle of the compressed page were decompressed without having decompressed other decompression blocks of the page, then the decompression may not become aware of the patterns used to compress the contents of the decompression block. This would result in having to decompress the decompression block by standard decompression rather than by matching previously used patterns. Decompression of the compressed page may be interrupted by an exception generated when one or more decompression blocks of the compressed page are decompressed. As described above, the exception may be generated based on decompressing the compressed page until reaching the end of one of the decompression blocks, or borders indicated by the metadata. The decompression block may be associated with an instruction in the compressed page designated for execution. The exception may be triggered by populating the remainder of the page with an instruction that will trigger the exception terminating the decompression of the page. The decompressed portion of the page may then be executed. The exception may further trigger decompression of the remainder of the page at a later time, such as after execution of the instructions in the decompressed portion of the page.

Being able to compress multiple decompression blocks within a page together enables lookbacks across multiple compression blocks, which improves efficiency and compression ratios compared to compressing the decompression blocks individually. Decompressing compressed pages containing multiple compression blocks compressed together may improve efficiencies by enabling decompression the page starting at either end. Sequential decompression of the compressed page allows the decompression to discover the patterns used in the compression lookbacks to decompress the multiple compression blocks.

For ease of description, the various aspects may be described in terms certain sizes, such as 4 Kb pages, and 1 Kb decompression blocks; however, the aspects may be used for any size of memory contents. Further, the term page is meant as an exemplary portion of memory, and many other terms indicating portions of memory, such a block, chunk, or line, may be used in accordance with the aspects.

FIG. 1 illustrates a system including a computing device 10 in communication with a remote computing device 50 suitable for use with the various aspects. The computing device 10 may include an SoC 12 with a processor 14, a memory 16, a communication interface 18, and a storage memory interface 20. The computing device may further include a communication component 22 such as a wired or wireless modem, a storage memory 24, an antenna 26 for establishing a wireless connection 32 to a wireless network 30, and/or the network interface 28 for connecting to a wired connection 44 to the Internet 40. The processor 14 may include any of a variety of hardware cores, as well as a number of processor cores. The SoC 12 may include one or more processors 14. The computing device 10 may include more than one SoCs 12, thereby increasing the number of processors 14 and processor cores. The computing device 10 may also include processor 14 that are not associated with an SoC 12. Individual processors 14 may be multi-core processors as described below with reference to FIG. 2. The processors 14 may each be configured for specific purposes that may be the same as or different from other processors 14 of the computing device 10. One or more of the processors 14 and processor cores of the same or different configurations may be grouped together.

The memory 16 of the SoC 12 may be a volatile or non-volatile memory configured for storing data and processor-executable code for access by the processor 14. In an aspect, the memory 16 may be configured to store data at least temporarily, such as compressed and decompressed processor-executable code instructions for access by one or more of the processors 14. In an aspect, the memory 16 may be configured to store information for relating to the compressed memory contents, such as decompression block boundary metadata, as described further herein.

The computing device 10 and/or SoC 12 may include one or more memories 16 configured for various purposes. In an aspect, one or more memories 16 may include volatile memories such as random access memory (RAM) or main memory, or cache memory. These memories 16 may be configured to temporarily hold a limited amount of data and/or processor-executable code instructions that is requested from non-volatile memory, loaded to the memories 16 from non-volatile memory in anticipation of future access based on a variety of factors, and/or intermediary processing data and/or processor-executable code instructions produced by the processor 14 and temporarily stored for future quick access without being stored in non-volatile memory.

The communication interface 18, communication component 22, antenna 26, and/or network interface 28, may work in unison to enable the computing device 10 to communicate over a wireless network 30 via a wireless connection 32, and/or a wired network 44 with the remote computing device 50. The wireless network 30 may be implemented using a variety of wireless communication technologies, including, for example, radio frequency spectrum used for wireless communications, to provide the computing device 10 with a connection to the Internet 40 by which it may exchange data with the remote computing device 50.

The storage memory interface 20 and the storage memory 24 may work in unison to allow the computing device 10 to store data on a non-volatile storage medium. The storage memory 24 may be configured much like an aspect of the memory 16 in which the storage memory 24 may store the compressed and decompressed processor-executable code instructions for access by one or more of the processors 14, and the decompression block boundary metadata. The storage memory 24, being non-volatile, may retain the information even after the power of the computing device 10 has been shut off. When the power is turned back on and the computing device 10 reboots, the information stored on the storage memory 24 may be available to the computing device 10. The storage memory interface 20 may control access to the storage memory 24 and allow the processor 14 to read data from and write data to the storage memory 24.

Some or all of the components of the computing device 10 may be differently arranged and/or combined while still serving the necessary functions. Moreover, the computing device 10 may not be limited to one of each of the components, and multiple instances of each component may be included in various configurations of the computing device 10.

Figure 2:
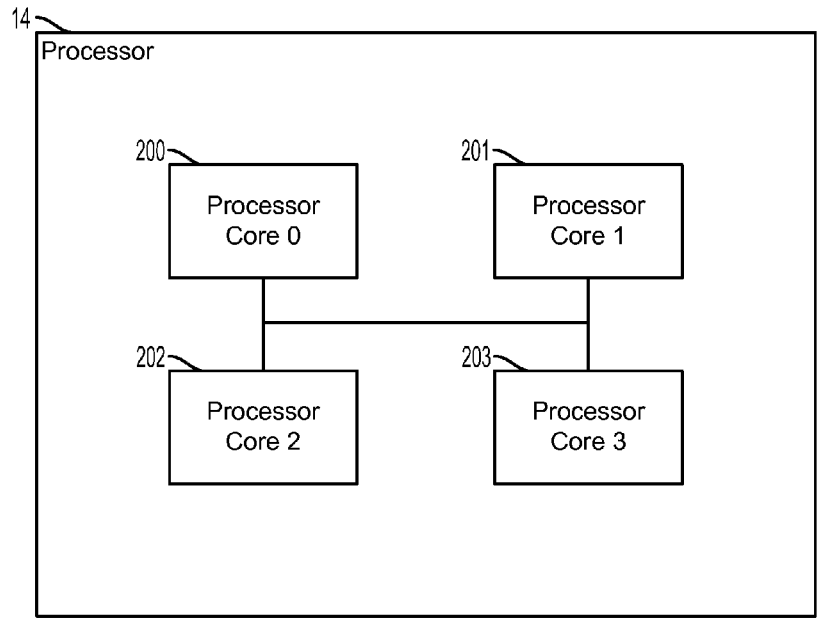
FIG. 2 is a component block diagram illustrating an example multi-core processor suitable for implementing an aspect.

FIG. 2 illustrates a multi-core processor 14 suitable for implementing an aspect. The multi-core processor 14 may have a plurality of homogeneous or heterogeneous processor cores 200, 201, 202, 203. The processor cores 200, 201, 202, 203 may be homogeneous in that, the processor cores 200, 201, 202, 203 of a single processor 14 may be configured for the same purpose and have the same or similar performance characteristics. For example, the processor 14 may be a general purpose processor, and the processor cores 200, 201, 202, 203 may be homogeneous general purpose processor cores. Alternatively, the processor 14 may be a graphics processing unit or a digital signal processor, and the processor cores 200, 201, 202, 203 may be homogeneous graphics processor cores or digital signal processor cores, respectively. For ease of reference, the terms "processor" and "processor core" may be used interchangeably herein.

The processor cores 200, 201, 202, 203 may be heterogeneous in that, the processor cores 200, 201, 202, 203 of a single processor 14 may be configured for different purposes and/or have different performance characteristics. Example of such heterogeneous processor cores may include what are known as "big.LITTLE" architectures in which slower, low-power processor cores may be coupled with more powerful and power-hungry processor cores.

In the example illustrated in FIG. 2, the multi-core processor 14 includes four processor cores 200, 201, 202, 203 (i.e., processor core 0, processor core 1, processor core 2, and processor core 3). For ease of explanation, the examples herein may refer to the four processor cores 200, 201, 202, 203 illustrated in FIG. 2. However, the four processor cores 200, 201, 202, 203 illustrated in FIG. 2 and described herein are merely provided as an example and in no way are meant to limit the various aspects to a four-core processor system. The computing device 10, the SoC 12, or the multi-core processor 14 may individually or in combination include fewer or more than the four processor cores 200, 201, 202, 203 illustrated and described herein.

Figure 3:
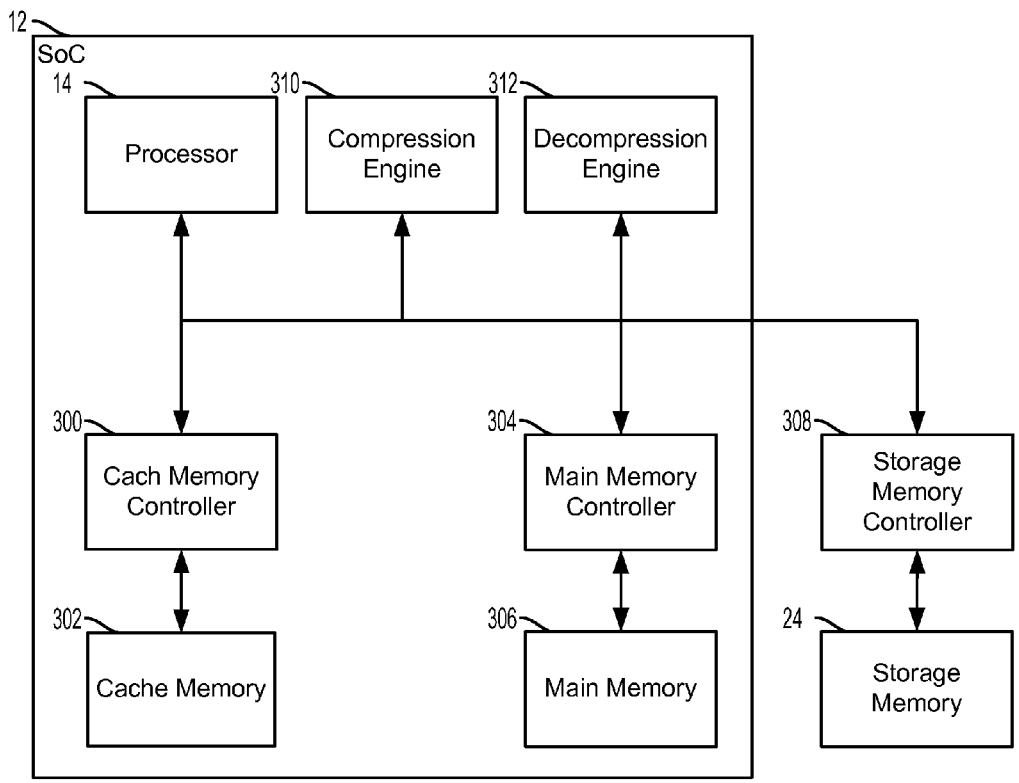
FIG. 3 is a component block diagram illustrating an example system on chip (SoC) suitable for implementing an aspect.

FIG. 3 illustrates an example SoC 12 including a cache memory controller 300, a cache memory 302, a main memory controller 304, a main memory 306, compression engine 310, decompression engine 312, and other components such as the components of the SoC 12 described above. The SoC may also include or be communicatively connected to a storage memory controller 308 and the storage memory 24. Each of the cache memory 302, the main memory 306, and the storage memory 24 may be configured to store compressed and/or decompressed memory contents, such as data and/or code instructions. The cache memory 302, the main memory 306, and the storage memory 24 may also store decompression block boundary metadata for the stored compressed memory contents. The decompression block boundary metadata may indicate the beginning and/or the end of decompression blocks containing one or more whole code instructions of the compressed memory contents, as described further herein.

The cache memory 302 may be configured to temporarily store data and code instructions for quicker access than when accessing the main memory 306 or the storage memory 24. The cache memory 302 may be dedicated for use by a single processor 14 or shared between multiple processors 14, and/or subsystems (not shown) of the SoC 12. In an aspect, the cache memory 302 may be part of the processor 14, and may be dedicated for use by a single processor core or shared between multiple processor cores of the processor 14. The cache memory controller 300 may manage access to the cache memory 302 by various processors 14 and subsystems (not shown) of the SoC 12. The cache memory controller 300 may also manage memory access requests for access from the cache memory controller 300 to the main memory 306 and the storage memory 24 for retrieving data that may be requested from the cache memory 302 by the processor 14, but not found in the cache memory 302 resulting in a cache miss.

The main memory 306 may be configured to temporarily store data and code instructions for quicker access than when accessing the storage memory 24. The main memory 306 may be available for access by the processors 14 of one or more SoCs 12, and/or subsystems (not shown) of the SoC 12. The main memory controller 304 may manage access to the main memory 306 by various processors 14 and subsystems (not shown) of the SoC 12 and computing device. The main memory controller 304 may also manage memory access requests for access by the main memory controller 304 to the storage memory 24 for retrieving data that may be requested from the main memory 306 by the processor 14 or the cache memory controller 300, but not found in the main memory 305 resulting in a main memory miss.

The storage memory 24 may be configured for persistent storage of data and code instructions for retention of the stored data and code instructions when the computing device is not powered. The storage memory 24 may be configured to store greater amounts of data and code instructions than the cache memory 302 and the main memory 306, and to store data and code instructions including those not being used or predicted for used in the near future by the processors 14 or subsystems (not shown) of the SoC 12. The storage memory 24 may be available for access by the processors 14 of one or more SoCs 12, and/or subsystems (not shown) of the SoC 12. The storage memory controller 308 may manage access to the storage memory 24 by various processors 14 and subsystems (not shown) of the SoC 12 and computing device. The storage memory controller 24 may also manage memory access requests for access from the cache memory controller 300 and the main memory controller 304 to the storage memory 24 for retrieving data that may be requested from the cache memory 302 or the main memory 306 by the processor 14, but not found in the cache memory 302 or the main memory 305 resulting in a cache memory miss or a main memory miss.

The compression engine 310 may be configured to compress data and code instructions for storage to and retrieval from the cache memory 302, the main memory 306, and the storage memory 24. The data and code instructions compressed by the compression engine 310 may be provided by the processors 14 and/or the subsystems of the SoC 12 (not shown). In compressing the data and code instructions, the compression engine 310 may employ various known compression schemes for various compression ratios. In an aspect, the compression engine 310 may compress data and code instructions divided contiguous blocks of memory, herein called pages. The pages may be of a fixed size, such a 4 Kb page. A page may be the unit of memory that may be transmitted between the cache memory 302, the main memory 306, and the storage memory 24. The compression engine 310 may compress data and code instructions contained within or to be written to a page of any of the memories 302, 306, and 24. All of the data and code instructions of a page may be compressed as a single unit. In other words, the contents of the page may be compressed based on the size of the page rather than individual or groups of data and code instructions within the page.

The compression engine 310 may also produce decompression block boundary metadata and add it to the compressed page. The decompression block boundary metadata may be used to indicate the beginning and/or end of decompression blocks within the compressed page. The decompression blocks may be portions of the compressed page that can be decompressed separately or in conjunction with other decompression blocks of the compressed page. The decompression blocks may be contained within a single page and have a smaller size than the compressed page. The decompression block boundary metadata may also indicate locations within the compressed page, at the beginning or end of the decompression blocks, where decompression of the compressed page may be interrupted. The decompression block boundary metadata may be configured such that only whole code instructions are contained within a decompression block. In other words, a single code instruction may not span a decompression block boundary. In an aspect, the processors 14 may be configured for fixed length code instructions; therefore the decompression block boundary metadata may indicate uniform length decompression blocks which may contain a fixed number of code instructions. It may also be possible to use variable length decompression blocks for fixed length code instructions as long as only whole code instructions are contained within the decompression blocks. In another aspect, the processors 14 may be configured for variable length code instructions. With variable length code instructions, the decompression block boundary metadata may indicate variable length decompression blocks which may contain a variable number of code instructions. Since the code instructions of a page may not be of the same length, it may not be possible to determine decompression block boundaries that contain the same number of whole code instructions. Therefore, variable length decompression blocks may be defined as long as each decompression block contains whole code instructions, and none of the code instructions span a decompression block boundary.

The decompression engine 312 may decompress the compressed pages. The decompression of the compressed pages may occur in response to memory access requests from the processors 14, which may request code instructions from specific locations in one of the memories 24, 302, and 306. The decompression engine 312 may receive a compressed stream containing a compressed page related to the memory location of the memory access request and the decompression block boundary metadata for the compressed page. By comparing the memory location of the memory access request with the decompression block boundary metadata, the decompression engine 312 may determine in which of the decompression blocks of the compressed page the requested code instruction resides. Using the identified decompression block, the decompression engine 312 may determine which decompression blocks of the compressed page to decompress. Depending on the decompression scheme used by the decompression engine 312, as described further herein, one or more of the decompression blocks may be decompressed to access the requested code instruction. The decompression engine 312 may substitute a fault or exception code, such as specific code instruction or a series of data that may include all zeros, for the remaining decompression blocks. The decompressed code instructions may be accessible by the requesting processor 14 for execution. In an aspect, the remaining decompression blocks may be scheduled for decompression at a later time. In an aspect, the remaining decompression blocks may be migrated to other hardware, such as a different processor core, processor, or hardware decompression engine, for decompression in parallel with the execution of the decompressed code instructions. In an aspect, the remaining decompression blocks may be decompressed in a time sliced manner with the execution of the decompressed code instructions.

The compression engine 310 and the decompression engine 312 may be implemented as software executed by the processor 14, as dedicated hardware, such as on a programmable processor device, or a combination of software and hardware. Some or all of the components of the SoC 12 may be differently arranged and/or combined while still serving the necessary functions. Moreover, the SoC 12 may not be limited to one of each of the components, and multiple instances of each component may be included in various configurations of the SoC 12.

Figure 4:
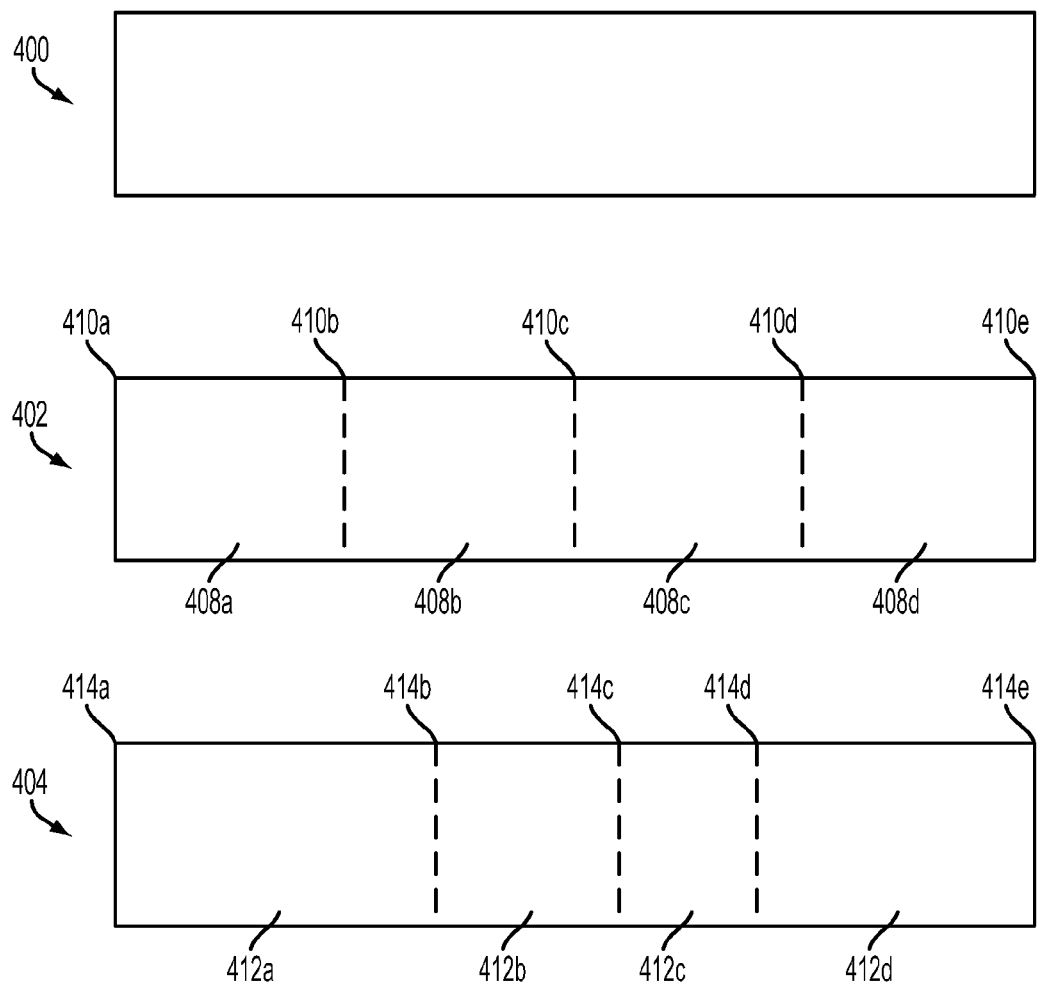
FIG. 4 is an illustration of a portion of compressed memory contents excluding and including decompression block boundary metadata in accordance with an aspect.
Figure 5:
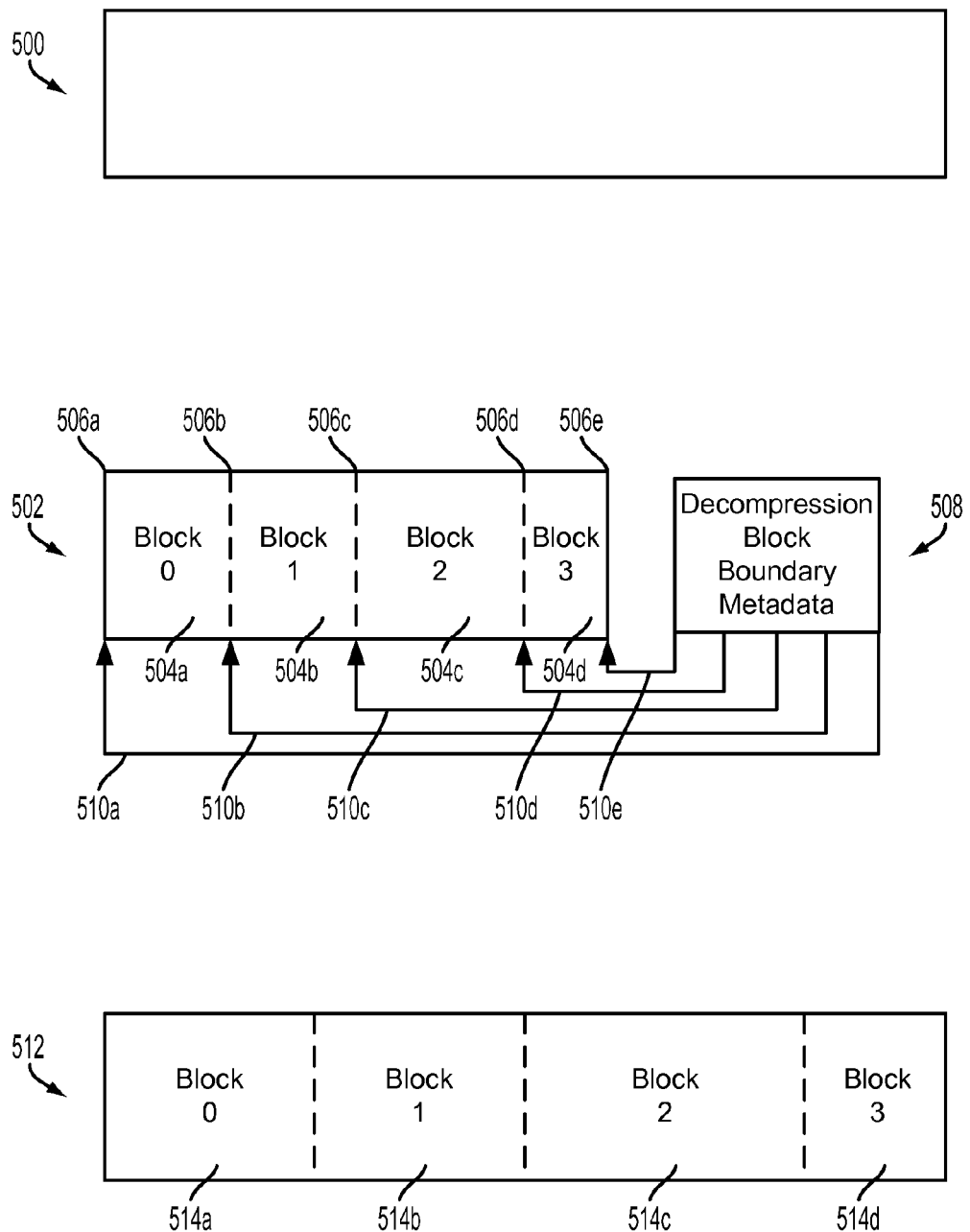
FIG. 5 is an illustration of a portion of memory contents in uncompressed, compressed, and decompressed states in accordance with an aspect.

The aspects illustrated in FIG. 4 and FIG. 5 illustrate examples of a page in various states of compression and decompression according to the aspects for compression and decompression described herein.

FIG. 4 illustrates a compressed page 400 excluding decompression block boundary metadata, a compressed page 402 including fixed length decompression block boundary metadata, and a compressed page 404 including variable length decompression block boundary metadata. The compressed page 400 excluding decompression block boundary metadata represents a page of memory contents from one of the memories that is compressed to a designated size, for example 4 Kb. The entire page of memory contents, whatever the original size, is compressed together as a single unit, thus the entire contents of the page is compressed as the single compressed page 400. The same hold true for compressed pages 402 and 404. In this example the memory contents of compressed pages 400, 402, and 404 may be the same, and they may be compressed in the same way to the same size using the same compression methods and ratios. The difference between compressed page 400 and compressed pages 402 and 404 is the addition of the decompression block boundary metadata 410a-410e and 414a-414e. The difference between compressed pages 402 and 404 is that compressed page 402 includes fixed length decompression block boundary metadata 410a-410e, and compress page 404 include variable length decompression block boundary metadata 414a-414e. The decompression block boundary metadata 410a-410e and 414a-414e defines the decompression blocks 408a-408d of compressed page 402 and decompression blocks 412a-412d of compressed page 404.

In each instance, the decompression engine may receive and view each compressed page 400, 402, and 404 as a complete compressed page. However, the addition of the decompression block boundary metadata 410a-410e and 414a-414e may allow the decompression engine to determine decompression blocks 408a-408d and 412a-412d. In an aspect, the decompression block boundary metadata 410a-410e and 414a-414e may be embedded within the compressed page 402 and 404. In an aspect, the decompression block boundary metadata 410a-410e and 414a-414e may accompany the compressed page 402 and 404 as part of a compression stream, such as in a data structure providing pointers to the location of the decompression block boundaries within the compressed page 402 and 404.

Resulting from the fixed length decompression block boundary metadata 410a-410e, decompression blocks 408a-408d may each be of equivalent length. Continuing with the 4 Kb compressed page 402 example, the four decompression blocks 408a-408d illustrated in FIG. 4 may each be 1 Kb in length. In an aspect, this is possible in a computing device using fixed length code instructions, such that all of the code instructions are the same length. In such computing devices, the length of the uncompressed page may generally be evenly divisible by a number of fixed length code instructions. Thus, the decompression engine may select a number and location of decompression block boundary metadata 410a-410e that evenly divides the compressed page such that each decompression block 408a-408d contains an equal number of whole fixed length code instructions. In an aspect, this may also be possible in a computing device using variable length code instructions, however it is more a matter of happenstance that the variable length instructions lend themselves to the conditions described above which allow for uniform length decompression blocks 408a-408d.

Resulting from the variable length decompression block boundary metadata 414a-414e, decompression blocks 412a-412d may each be of variable and/or equivalent length. Continuing with the 4 Kb compressed page 404 example, the four decompression blocks 412a-412d illustrated in FIG. 4 may each be different in length. In an aspect, this is possible in a computing device using variable length code instructions, such that all of the code instructions are likely different lengths. In such computing devices, the length of the uncompressed page may generally be unevenly divisible by a number of variable length code instructions. Thus, the decompression engine may select a number and location of decompression block boundary metadata 414a-414e that divides the compressed page such that each decompression block 412a-412d contains whole variable length code instructions. Since the code instructions may not easily fit into equivalent length decompression blocks, such that no variable length code instruction spans any decompression block boundaries, the decompression engine may select variable length decompression block boundary metadata 414a-414e that defined variable length decompression block 412a-412d. As noted above, it is possible in a computing device using variable code instructions that instances may occur where the variable length decompression block 412a-412d may be of equivalent length. It is also possible in a computing device using fixed length code instructions to apply variable length decompression block boundary metadata as long as no fixed length code instruction spans any decompression block boundaries.

It should be apparent that the number of decompression blocks in various implementations need not be limited to four as in these examples and may be greater than or fewer than four depending on various factors, such as page length, code instruction length, and design choices for the decompression engine.

FIG. 5 illustrates an uncompressed page 500, a compressed page 502 with decompression block metadata 508, and decompressed page 512 in accordance with an aspect. The uncompressed page 500 may contain code instructions stored in one of the memories. The uncompressed page 500 may be compressed by the compression engine into compressed page 502. The compression engine may create decompression block boundary metadata 508 during the compression process. In an aspect the decompression block boundary metadata 508 may be contained in a separate data structure from the compressed block 502. The decompression block boundary metadata 508 may contain information, such as pointers 510a-510e, which may be used by the decompression engine to determine the decompression block boundaries 506A-506e. The pointers 510a-510e may correspond to addresses within the compressed page 502 that correspond to addresses of the uncompressed page 500. The decompression block boundary metadata 508 may relate the pointers 510a-510 e with the corresponding address of the uncompressed page 500. This relationship between the pointers 510a-510 e and the corresponding address of the uncompressed page 500 may allow the decompression engine to identify the decompression blocks 504a-504d that contain the requested code instruction of a memory access request for a memory location within uncompressed page 500.

In response to a memory access request for at least one of the code instructions contained within the uncompressed page 500, the decompression engine may received the related compressed page 502 and the decompression block boundary metadata 508. Based on the memory location within uncompressed page 500 of the memory access request, the decompression engine may determine in which decompression block 504a-504d of compressed page 502 the requested compressed code instruction resides. The decompression engine may compare the memory location of the memory access request to the decompression block boundary metadata 508. The memory location of the memory access request may be interpreted by the decompression engine to equal one or sit between two decompression block boundaries 506A-506e as indicated in the decompression block boundary metadata 508 by pointers 510a-510e.

Depending on the decompression block(s) 504a-504d determined to contain the compressed code instruction, and on the decompression scheme, described further herein, the decompression engine may select which decompression block(s) 504a-504d to decompress. In various situations, the decompression engine may decompress any one or any contiguous decompression blocks 504a-504d. Any decompression blocks 504a-504d not selected for decompression based on the memory access request may be decompressed after the selected decompression blocks 504a-504d. The decompressed page 512 illustrates a fully decompressed version of the compressed page 502. The decompress page 512 may be equivalent in length and content to the uncompressed page 500, and it may have been decompressed in stages, decompressing various decompressed blocks 514a-514d, which correspond to the decompression blocks 504a-504d, at different times.

Figure 6A:
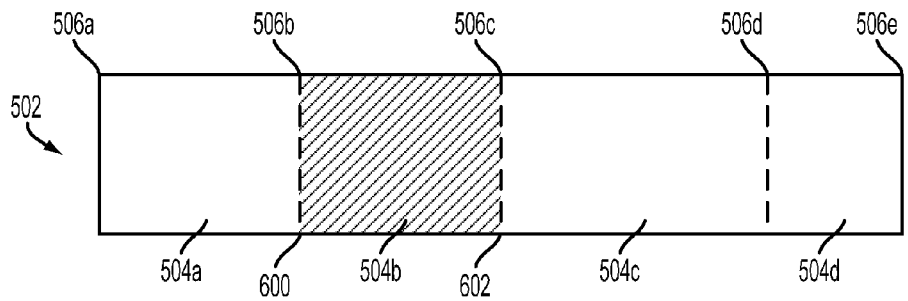
FIGS. 6A-6D are illustrations of decompression plans for a portion of compressed memory contents using decompression block boundary metadata in accordance with an aspect.

FIGS. 6A-6D illustrate decompression schemes for a compressed page 502 using decompression block boundary metadata in accordance with an aspect. As in FIG. 5 the decompression block boundary metadata may identify decompression block boundaries 506A-506e and decompression blocks 504a-504d. FIG. 6A illustrates an aspect in which the decompression engine identifies that the requested compressed code instruction resides in decompression block 504b. The decompression scheme used in this aspect may be one that only requires the decompression of the decompression block containing the compressed code instructions, decompression block 504b. The decompression engine may identify the decompression block boundaries 506B and 506C for decompression block 504b from the decompression block boundary metadata. The decompression engine may determine decompression block boundary 506B as a decompression starting point 600 and decompression block boundary 506C as a decompression ending point 602. The decompression engine may substitute a fault or exception code, such as specific code instruction or a series of data that may include all zeros, for the remaining decompression blocks 504a, 504c, and 504d.

Figure 6B:
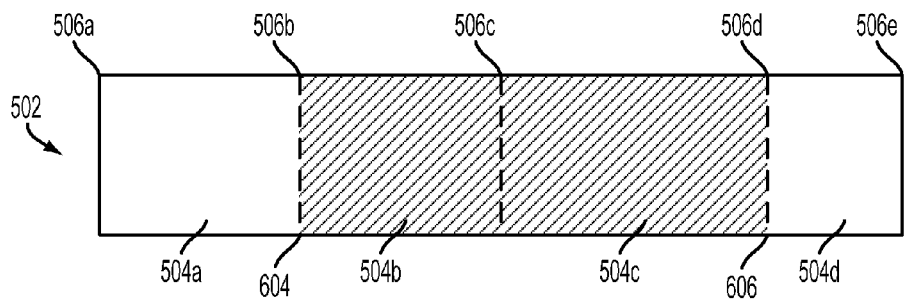

FIG. 6B illustrates an aspect in which the decompression engine identifies that multiple requested compressed code instructions reside in both decompression block 504b and 504c, or that the requested compressed code instruction resides in either decompression block 504b or 504c. The decompression scheme used in this aspect where the multiple requested compressed code instructions reside in both decompression block 504b and 504c may be similar to the one described in FIG. 6A. The similarities are the decompression scheme may only require the decompression of the decompression block containing the compressed code instructions, decompression blocks 504b and 504c. The decompression engine may identify the decompression block boundaries 506B, 506C, and 506D for decompression blocks 504b and 504c from the decompression block boundary metadata. The decompression engine may determine decompression block boundary 506B as a decompression starting point 604 and decompression block boundary 506D as a decompression ending point 606. The decompression engine may substitute the fault or exception code for the remaining decompression blocks 504a, and 504d.

In an aspect illustrated in FIG. 6B where the requested compressed code instruction resides in either decompression block 504b or 504c, the decompression scheme may still call for the decompression of the other decompression block 504b or 504c. In such an aspect, the decompression scheme may be configured to take advantage of the locality of code instructions in an effort to decompress the compressed page in a manner that may improve the efficiency of the decompression and execution of the code instructions. Code instructions related to the requested code instruction may be stored in memory at an address near the requested code instruction, and may be located within the same page. Although the related code instruction has not yet been requested, there is potential for such a request. Therefore, the decompression scheme may call for the decompression of a number of decompression blocks near the decompression block containing the requested code instruction. The decompressed related code instructions may be stored in one of the memories, such as cache memory, for quick access if it is called without having to decompress another compressed page. Since the requested code instruction is located within one of decompression block 504b or 504c, the decompression scheme using locality may also determine to decompress the other of decompression block 504b or 504c.

It should be recognized that this aspect decompression scheme may not be limited to decompression of only one additional decompression block, nor do the addition decompression blocks have to be on the same side of the decompression block containing the requested code instruction.

Figure 6C:
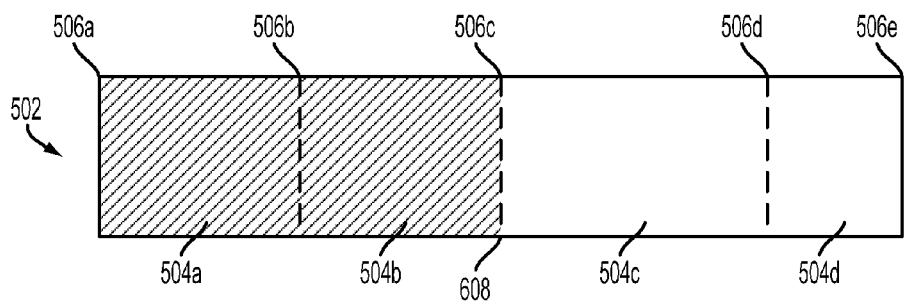
Figure 6D:
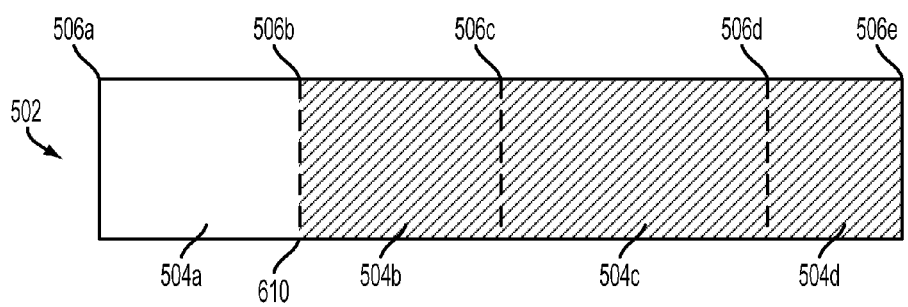

FIGS. 6C and 6D illustrate aspects in which the decompression scheme is configured to take advantage of lookback opportunities for patterns of compression and decompression. In these aspects the decompression engine identifies that the requested compressed code instruction resides in decompression block 504b. The decompression scheme used in these aspects may be one that requires the decompression of each of the decompression blocks between one end of the compressed page 502 and the decompression block containing the compressed code instructions, decompression block 504b. The decompression engine may identify the decompression block boundary 506B for decompression block 504b from the decompression block boundary metadata. The decompression engine may determine decompression block boundary 506B as a decompression ending point 610. The decompression engine may substitute a fault or exception code for the remaining decompression blocks 504c and 504d in FIG. 6C and decompression block 504a in FIG. 6D.

In these aspects, as the decompression engine propagates from either end of the compressed page 502 to the end of the decompression block 504b, the decompression engine beings to build a local dictionary of decompression patterns for the compressed page 502. The dictionary may contain relationships between compressed and decompressed forms of the code instructions of compressed page 502. The decompression engine may be able to identify patterns in the compressed page 502 that match patterns of previously uncompressed portions of compressed page 502 and used the dictionary to decompress the identified patterns rather than having to determine the decompression via a decompression algorithm. This process may save time and computing device resources from being used to decompress portions of compressed page 502.

Figure 7A:
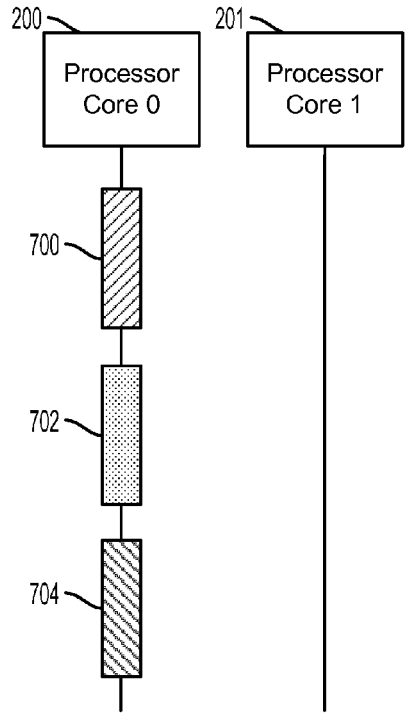
FIGS. 7A-7D are illustrations of hardware handling of decompression of compressed memory contents in accordance with an aspect.

FIGS. 7A-7D illustrate hardware handling of decompression of compressed memory contents and execution of the decompress code instructions. The aspects illustrated in FIGS. 7A-7D depict only two hardware components, processor core 0 200 and processor cores 1 201. These hardware components are described above, relating to FIG. 2, as two processor cores of the same processor. It should be understood that these hardware components are merely examples, and that the aspects described herein may be implemented using various processor cores, processors, and dedicated hardware of various configurations and distributions within the computing device. FIG. 7A illustrates an aspect in which processor core 0 200 handles all of the decompression 700 and 704 of a compressed page and the execution 702 of a decompressed code instruction. The decompression 700 may represent the decompression of the decompression blocks of the compressed page identified for decompression according to any of the decompression schemes described above. The decompression 700 is therefore the decompression of less than all of the compressed page from either an identified decompression starting point or either end of the compressed page to an identified decompression ending point. The decompression 700 ends once it completes decompressing the decompression blocks identified for decompression. The execution 702 may represent the execution of the requested code instructions of the memory access request which prompted the decompression 700. The code instructions were decompressed during the decompression 700 and are therefore accessible for the execution 702. Once the execution 702 is complete, the decompression 704 may decompress the remainder of the decompression blocks of the compressed page. In an aspect the decompression 704 does not need to occur directly after the completion of the execution 702, and may occur after various other code instructions have been executed.

Figure 7B:
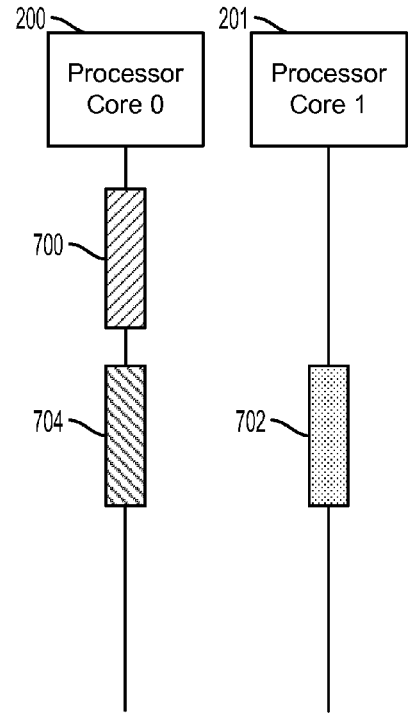

FIG. 7B illustrates an aspect in which processor core 0 200 handles all of the decompression 700 and 704 of a compressed page and the processor core 1 201 handles the execution 702 of a decompressed code instruction. The decompression 700 may occur as described above. In an aspect, once the decompression 700 is complete, the execution 702 may be migrated or scheduled to occur on a different processor from the decompression 700. Thus, the execution 702 may be implemented by processor core 1 201. Concurrent with the execution 702, processor core 0 may implement decompression 704 to decompress the remainder of the decompression blocks of the compress page. In an aspect, the execution 702 and decompression 704 do not have to commence simultaneously or even occur concurrently, however it may be advantageous to implement each operation concurrently as it may increase the overall performance time of the memory access request.

Figure 7C:
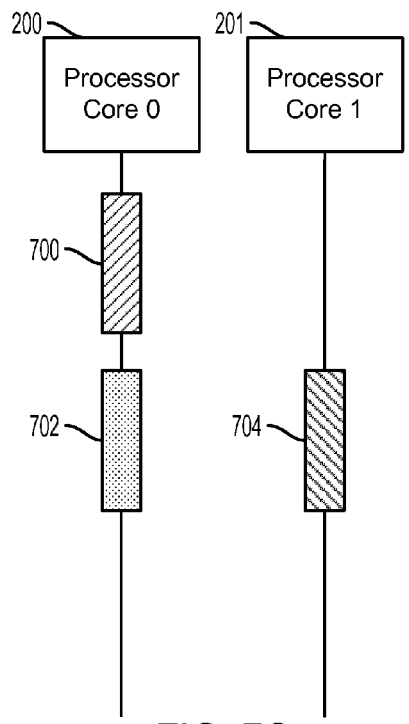
Figure 7D:
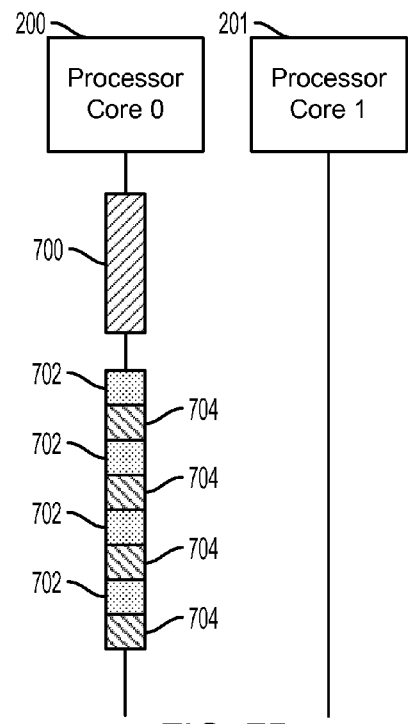

FIG. 7C illustrates an aspect in which processor core 0 200 handles the decompression 700 of a compressed page and the execution 702 of a decompressed code instruction, while the processor core 1 201 handles the decompression 704 of the compressed page. The decompression 700 may occur as described above. In an aspect, once the decompression 700 is complete, the execution 702 of the decompressed code instruction may be implemented by the processor core 0 200. Before or concurrent with the execution 702, the decompression 704 may be migrated or scheduled to occur on a different processor from the decompression 700 and/or the execution 702. Thus, the decompression 704 of the remaining decompression blocks of the compressed page may be implemented by processor core 1 201. In an aspect, the execution 702 and decompression 704 do not have to commence simultaneously or even occur concurrently, however it may be advantageous to implement each operation concurrently as it may increase the overall performance time of the memory access request.

FIG. 7C illustrates an aspect in which processor core 0 200 handles all of the decompression 700 and 704 of the compressed page and the execution 702 of the decompressed code instruction. The decompression 700 may occur as described above. In an aspect, once the decompression 700 is complete, the execution 702 and the decompression 704 of the remainder of the decompression blocks of the compressed page may be implemented in a time sliced manner on the same hardware component, such as processor core 0 200. In an aspect, the allocation of time for the execution 702 and the decompression 704 may or may not be equivalent time slices. Further, should one of the execution 702 or the decompression 704 complete prior to the other, the continuing operation may continue until completion.

Figure 8:
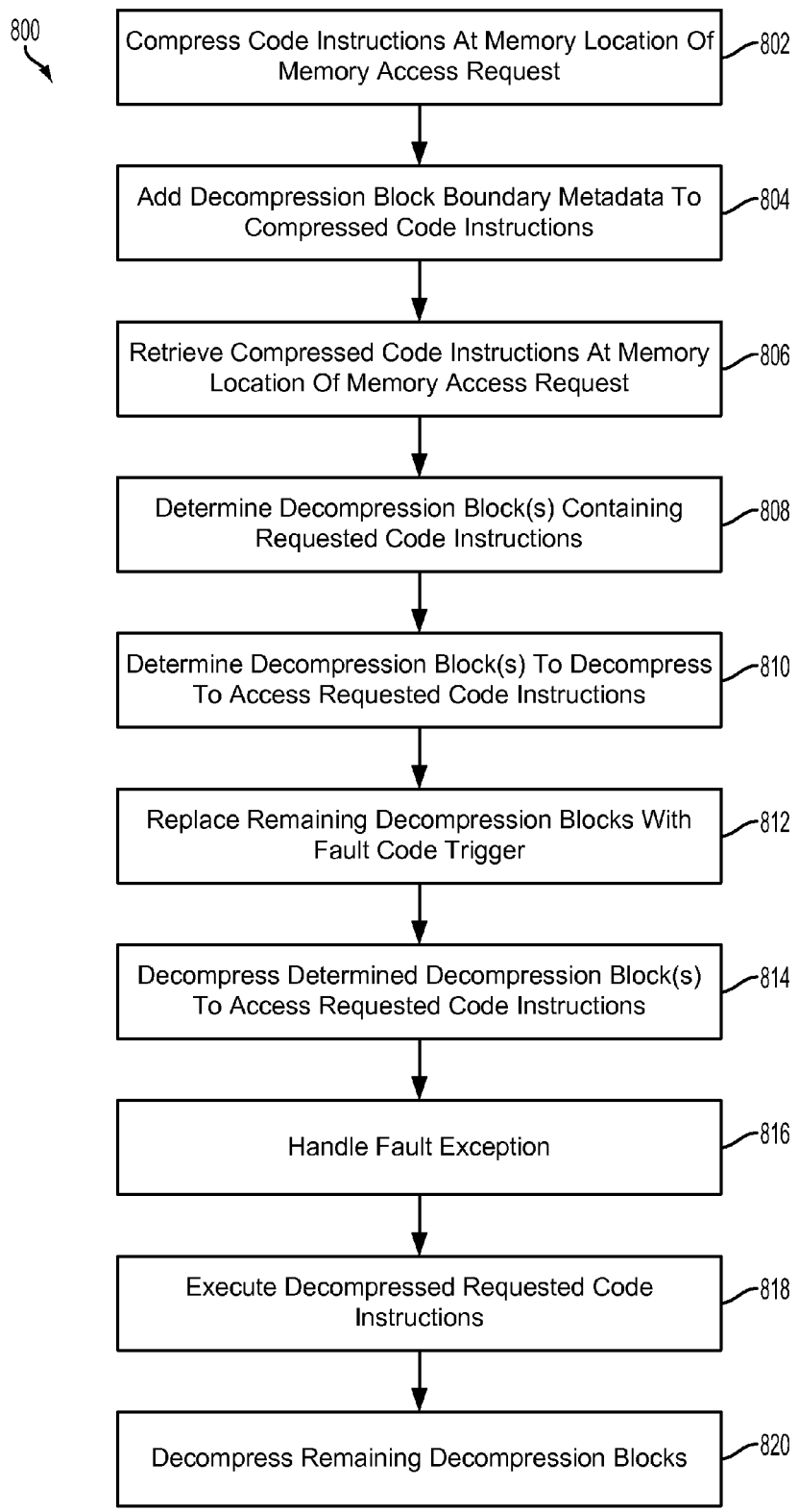
FIG. 8 is process flow diagram illustrating an aspect method for implementing decompression of compressed memory contents using decompression block boundary metadata.

FIG. 8 illustrates an aspect method 800 for implementing decompression of compressed memory contents using decompression block boundary metadata. The method 800 may be executed in a computing device using software, general purpose or dedicated hardware, such as the processor, compression and/or decompression engines, the cache, main, and/or storage memory controllers, or a combination of software and hardware. In block 802, the computing device may compress a page containing code instructions stored in one of the memories at a location indicated by a memory access request. In an aspect, the compression of the page containing the code instruction may occur in response to a memory access request for the code instruction to reduce the cost of transmitting the page between components of the computing device. In an aspect, the compression for the page containing the code instruction may occur prior to a memory access request and the compressed page may be stored in memory and accessed in response to a memory access request. In block 804, the computing device may add decompression block boundary metadata to the compressed page. As discussed above, in an aspect, the decompression block boundary metadata may be embedded in the compressed page. In an aspect, the decompression block boundary metadata may be associated with a compressed page and may be stored together or separate from the compressed page in a data structure, such as a table, that may relate the decompression block boundary metadata with locations within the uncompressed page. The decompression block boundary metadata may be included in a compression stream along with the compressed page when being transmitted between components of the computing device.

In block 806, the computing device may retrieve the compressed page containing requested code instructions of a memory access request. In an aspect, retrieving the compressed page may be executed directly or indirectly. An example of a direct execution of the retrieval of the compressed page may include a hardware component of the computing device, such as a processor, directly requesting access from the memory in which the compressed page resides. An example of an indirect execution of the retrieval of the compressed page may include the hardware component of the computing device requesting access from a memory which does not currently contain the compressed page. Resulting from this memory miss, a controller of the memory requesting access from another memory in which the compressed page resides. As noted above, retrieving the compressed page may also result in retrieving the decompression block boundary metadata associated with the compressed page.

In block 808, the computing device may determine which decompression block(s) of the compressed page contain the code instructions of the memory access request. As the decompression block boundary metadata may associate locations within the uncompressed page with the decompression block boundary locations of the compressed page, the computing device ma use these associations to determine the location of the code instruction in the compressed page. For example, the decompression blocks of the compressed page may be bound on either side between decompression block boundaries identified in the decompression block boundary metadata. The data structure containing the decompression block boundary metadata may associate these locations with equivalent locations in the uncompressed page. The address included in the memory access request may be compared to the equivalent locations of the uncompressed page to determine between which of the equivalent locations the memory access address falls. With this information, the computing device may determine that the location of the compressed code instruction is in the decompression block bounded by the decompression block boundaries associated with the equivalent uncompressed page location between which the memory access address fall.

In block 810, the computing device may determine which of the decompression blocks of the compressed page to decompress. In an aspect, the decompression blocks to decompress will include at least the decompression blocks containing the code instructions of the memory access requests. In various aspects, the decompression blocks to decompress may also depend on the decompression scheme being implemented. As discussed above, a decompression scheme may include taking advantage of the locality of the code instruction, which may include selecting decompression blocks in close proximity to the decompression block containing the code instructions of the memory access request. Another decompression scheme may include selecting the decompression blocks between one end of the compressed page and the decompression block containing the code instructions of the memory access request to take advantage of the lookback opportunities created while decompressing the decompression blocks.

In block 812, the computing device may substitute a fault or exception code for the decompression blocks of the compressed page not slated for decompression in block 810. The fault or exception code may be a particular code configured to induce an error handling function as described below. In an aspect, the fault or exception code may include substituting the decompression blocks for a string or constants or a certain pattern of data, such as all zero values.

In block 814, the computing device may decompress the determined decompression blocks from block 810 to access the code instruction of the memory access request. The decompression may terminate once the decompression of the determined decompression blocks is complete and the remaining decompression blocks of the compressed page are substituted by the fault or exception code. In block 816, the computing device may encounter and handle the fault or exception triggered by the fault or exception code substituted for the decompression blocks in block 812. In an aspect, handling the fault or exception may involve scheduling or deferring the decompression of the remainder of the compressed page for a later time. In an aspect, handling the fault or exception may involve migrating or scheduling the decompression of the remaining decompression blocks for different hardware components than the ones for executing the decompressed code instruction. In an aspect, handling the fault or exception may involve migrating or scheduling the execution of the decompressed code instruction for different hardware components than the ones for decompressing the remaining decompression blocks. In an aspect, handling the fault or exception may involve scheduling executing the decompressed code instruction and decompressing the remaining decompression blocks in a time sliced manner on the same hardware components.

In block 818, the computing device may execute the decompressed code instructions of the memory access request. In block 820, the computing device may decompress the remaining decompression blocks of the compressed page. As noted above, the execution of the decompressed code instruction may be implemented before or concurrently with the decompression of the remaining decompression blocks of the compressed page. Concurrent execution with the decompression may occur in parallel on separate hardware components or in a time sliced manner on the same hardware component.

Figure 9:
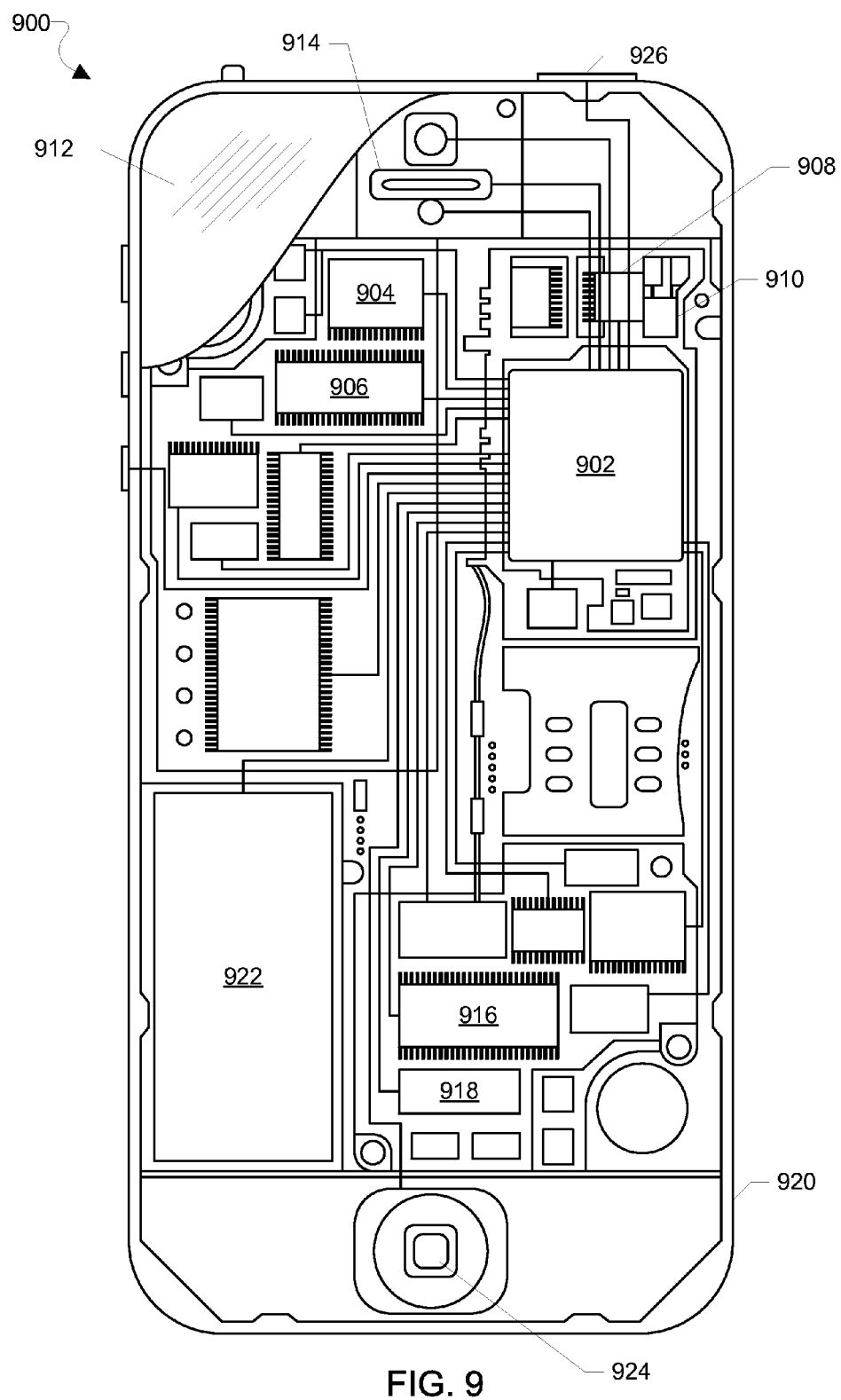
FIG. 9 is component block diagram illustrating an example mobile computing device suitable for use with the various aspects.

The various aspects (including, but not limited to, aspects discussed above with reference to FIGS. 1-8) may be implemented in a wide variety of computing systems, which may include an example mobile computing device suitable for use with the various aspects illustrated in FIG. 9. The mobile computing device 900 may include a processor 902 coupled to a touchscreen controller 904 and an internal memory 906. The processor 902 may be one or more multicore integrated circuits designated for general or specific processing tasks. The internal memory 906 may be volatile or non-volatile memory, and may also be secure and/or encrypted memory, or unsecure and/or unencrypted memory, or any combination thereof. Examples of memory types which can be leveraged include but are not limited to DDR, LPDDR, GDDR, WIDEIO, RAM, SRAM, DRAM, P-RAM, R-RAM, M-RAM, STT-RAM, and embedded DRAM. The touchscreen controller 904 and the processor 902 may also be coupled to a touchscreen panel 912, such as a resistive-sensing touchscreen, capacitive-sensing touchscreen, infrared sensing touchscreen, etc. Additionally, the display of the computing device 900 need not have touch screen capability.

The mobile computing device 900 may have one or more radio signal transceivers 908 (e.g., Peanut, Bluetooth, Zigbee, Wi-Fi, RF radio) and antennae 910, for sending and receiving communications, coupled to each other and/or to the processor 902. The transceivers 908 and antennae 910 may be used with the above-mentioned circuitry to implement the various wireless transmission protocol stacks and interfaces. The mobile computing device 900 may include a cellular network wireless modem chip 916 that enables communication via a cellular network and is coupled to the processor.

The mobile computing device 900 may include a peripheral device connection interface 918 coupled to the processor 902. The peripheral device connection interface 918 may be singularly configured to accept one type of connection, or may be configured to accept various types of physical and communication connections, common or proprietary, such as USB, FireWire, Thunderbolt, or PCIe. The peripheral device connection interface 918 may also be coupled to a similarly configured peripheral device connection port (not shown).

Figure 10:
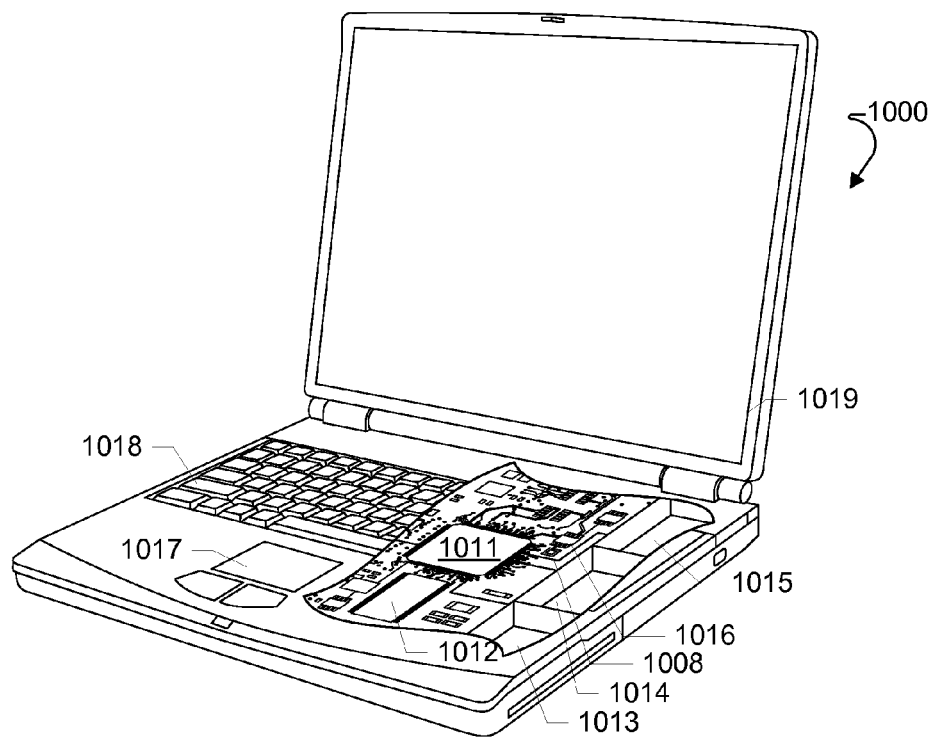
FIG. 10 is component block diagram illustrating an example mobile computing device suitable for use with the various aspects.

The mobile computing device 900 may also include speakers 914 for providing audio outputs. The mobile computing device 900 may also include a housing 920, constructed of a plastic, metal, or a combination of materials, for containing all or some of the components discussed herein. The mobile computing device 900 may include a power source 922 coupled to the processor 902, such as a disposable or rechargeable battery. The rechargeable battery may also be coupled to the peripheral device connection port to receive a charging current from a source external to the mobile computing device 900. The mobile computing device 900 may also include a physical button 924 for receiving user inputs. The mobile computing device 900 may also include a power button 926 for turning the mobile computing device 900 on and off The various aspects (including, but not limited to, aspects discussed above with reference to FIGS. 1-8) may be implemented in a wide variety of computing systems, which may include a variety of mobile computing devices, such as a laptop computer 1000 illustrated in FIG. 10. Many laptop computers include a touchpad touch surface 1017 that serves as the computer's pointing device, and thus may receive drag, scroll, and flick gestures similar to those implemented on computing devices equipped with a touch screen display and described above. A laptop computer 1000 will typically include a processor 1011 coupled to volatile memory 1012 and a large capacity nonvolatile memory, such as a disk drive 1013 of Flash memory. Additionally, the computer 1000 may have one or more antenna 1008 for sending and receiving electromagnetic radiation that may be connected to a wireless data link and/or cellular telephone transceiver 1016 coupled to the processor 1011. The computer 1000 may also include a floppy disc drive 1014 and a compact disc (CD) drive 1015 coupled to the processor 1011. In a notebook configuration, the computer housing includes the touchpad 1017, the keyboard 1018, and the display 1019 all coupled to the processor 1011. Other configurations of the computing device may include a computer mouse or trackball coupled to the processor (e.g., via a USB input) as are well known, which may also be used in conjunction with the various aspects.

Figure 11:
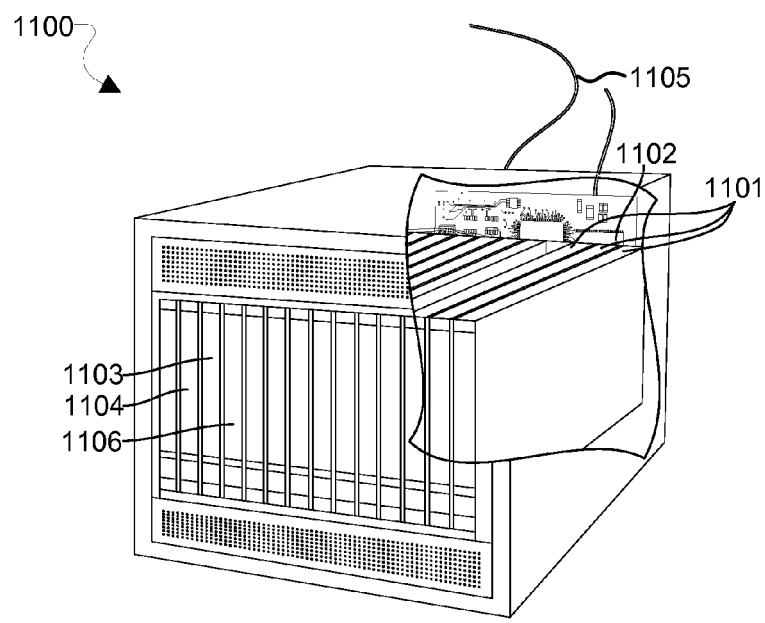
FIG. 11 is component block diagram illustrating an example server suitable for use with the various aspects.

The various aspects (including, but not limited to, aspects discussed above with reference to FIGS. 1-8) may be implemented in a wide variety of computing systems, which may include any of a variety of commercially available servers for compressing data in server cache memory. An example server 1100 is illustrated in FIG. 11. Such a server 1100 typically includes one or more multi-core processor assemblies 1101 coupled to volatile memory 1102 and a large capacity nonvolatile memory, such as a disk drive 1104. As illustrated in FIG. 11, multi-core processor assemblies 1101 may be added to the server 1100 by inserting them into the racks of the assembly. The server 1100 may also include a floppy disc drive, compact disc (CD) or DVD disc drive 1106 coupled to the processor 1101. The server 1100 may also include network access ports 1103 coupled to the multi-core processor assemblies 1101 for establishing network interface connections with a network 1105, such as a local area network coupled to other broadcast system computers and servers, the Internet, the public switched telephone network, and/or a cellular data network (e.g., CDMA, TDMA, GSM, PCS, 3G, 4G, LTE, or any other type of cellular data network).

Computer program code or "program code" for execution on a programmable processor for carrying out operations of the various aspects may be written in a high level programming language such as C, C++, C#, Smalltalk, Java, JavaScript, Visual Basic, a Structured Query Language (e.g., Transact-SQL), Perl, or in various other programming languages. Program code or programs stored on a computer readable storage medium as used in this application may refer to machine language code (such as object code) whose format is understandable by a processor.

Many computing devices operating system kernels are organized into a user space (where non-privileged code runs) and a kernel space (where privileged code runs). This separation is of particular importance in Android and other general public license (GPL) environments in which code that is part of the kernel space must be GPL licensed, while code running in the user-space may not be GPL licensed. It should be understood that the various software components/modules discussed here may be implemented in either the kernel space or the user space, unless expressly stated otherwise.

The foregoing method descriptions and the process flow diagrams are provided merely as illustrative examples and are not intended to require or imply that the operations of the various aspects must be performed in the order presented. As will be appreciated by one of skill in the art the order of operations in the foregoing aspects may be performed in any order. Words such as "thereafter," "then," "next," etc. are not intended to limit the order of the operations; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm operations described in connection with the various aspects may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more aspects, the functions described may be implemented in hardware, software, firmware, or any combination thereof. If implemented in software, the functions may be stored as one or more instructions or code on a non-transitory computer-readable medium or a non-transitory processor-readable medium. The operations of a method or algorithm disclosed herein may be embodied in a processor-executable software module that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed aspects is provided to enable any person skilled in the art to make or use the present invention. Various modifications to these aspects will be readily apparent to those skilled in the art, and the generic principles defined herein may be applied to other aspects without departing from the spirit or scope of the invention. Thus, the present invention is not intended to be limited to the aspects shown herein but is to be accorded the widest scope consistent with the following claims and the principles and novel features disclosed herein.

What is claimed is:

1. A method for executing decompression of a compressed page on a computing device, comprising:
   receiving a memory access request for retrieving a first code instruction of a plurality of code instructions of a page from a memory device; and
   in response to receiving the memory access request:
      determining a first decompression block of the compressed page containing the first code instruction;
      substituting a second decompression block of the compressed page with an exception code;
      decompressing the compressed page starting at a first end of the compressed page; and
      terminating decompression of the compressed page in response to completing decompression of the first decompression block.

2. The method of claim 1, further comprising:
   building a local dictionary of patterns of compressed information of the compressed page related to decompressed information resulting from decompressing the compressed page; and
   using the local dictionary to decompress compressed information of the compressed page.

3. The method of claim 1, wherein decompressing the compressed page starting at a first end of the compressed page comprises decompressing the first decompression block.

4. The method of claim 1, further comprising:
   determining decompression block boundaries of a plurality of decompression blocks of the compressed page; and
   generating decompression block boundary metadata associated with the compressed page indicating the decompression block boundaries for each of the plurality of decompression blocks.

5. The method of claim 1, further comprising:
   executing the first code instruction after terminating decompression of the compressed page; and
   decompressing the second decompression block after terminating decompression of the compressed page.

6. The method of claim 5, wherein decompressing the second decompression block after terminating decompression of the compressed page comprises decompressing the second decompression block after executing the first code instruction.

7. The method of claim 5, wherein decompressing the second decompression block after terminating decompression of the compressed page and executing the first code instruction after terminating decompression of the compressed page comprise executing the first code instruction and decompressing the second decompression block time sliced with each other.

8. The method of claim 5, further comprising:
   scheduling executing the first code instruction on a first processor core;
   scheduling decompressing the second decompression block on a second processor core; and
   scheduling executing the first code instruction and decompressing the second decompression block to execute in parallel.

9. A computing device, comprising:
   a processor;
   a memory device communicatively connected to the processor and configured to store code instructions; and
   a decompression engine communicatively connected to the processor and the memory device and configured to perform operations comprising:
      receiving a memory access request for retrieving a first code instruction of a plurality of code instructions of a page from the memory device; and
      in response to receiving the memory access request:
         determining a first decompression block of a compressed page containing the first code instruction;
         substituting a second decompression block of the compressed page with an exception code;
         decompressing the compressed page starting at a first end of the compressed page; and
         terminating decompression of the compressed page in response to completing decompression of the first decompression block.

10. The computing device of claim 9, wherein the decompression engine is configured to perform operations further comprising:
    building a local dictionary of patterns of compressed information of the compressed page related to decompressed information resulting from decompressing the compressed page; and
    using the local dictionary to decompress compressed information of the compressed page.

11. The computing device of claim 9, wherein the decompression engine is configured to perform operations such that decompressing the compressed page starting at a first end of the compressed page comprises decompressing the first decompression block.

12. The computing device of claim 9, further comprising:
    a compression engine communicatively connected to the processor, the memory device, and the decompression engine and configured to perform operations comprising:
       determining decompression block boundaries of a plurality of decompression blocks of the compressed page; and
       generating decompression block boundary metadata associated with the compressed page indicating the decompression block boundaries for each of the plurality of decompression blocks.

13. The computing device of claim 9, wherein:
    the processor is configured with processor-executable instructions to perform operations comprising executing the first code instruction after decompression of the compressed page terminates; and
    the decompression engine is configured to perform operations further comprising decompressing the second decompression block after terminating decompression of the compressed page.

14. The computing device of claim 13, wherein the decompression engine is configured to perform operations such that decompressing the second decompression block after terminating decompression of the compressed page comprises decompressing the second decompression block after executing the first code instruction.

15. The computing device of claim 13, wherein the decompression engine is configured to perform operations such that decompressing the second decompression block after terminating decompression of the compressed page and executing the first code instruction after terminating decompression of the compressed page comprise executing the first code instruction and decompressing the second decompression block time sliced with each other.

16. The computing device of claim 13, wherein the decompression engine is configured to perform operations further comprising:
scheduling executing the first code instruction on a first processor core;
scheduling decompressing the second decompression block on a second processor core; and
scheduling executing the first code instruction and decompressing the second decompression block to execute in parallel.

17. A non-transitory processor-readable medium having stored thereon processor-executable software instructions to cause a processor to perform operations comprising:
receiving a memory access request for retrieving a first code instruction of a plurality of code instructions of a page from a memory device; and
in response to receiving the memory access request:
determining a first decompression block of a compressed page containing the first code instruction;
substituting a second decompression block of the compressed page with an exception code;
decompressing the compressed page starting at a first end of the compressed page; and
terminating decompression of the compressed page in response to completing decompression of the first decompression block.

18. The non-transitory processor-readable medium of claim 17, wherein the stored processor-executable software instructions are configured to cause a processor to perform operations further comprising:
building a local dictionary of patterns of compressed information of the compressed page related to decompressed information resulting from decompressing the compressed page; and
using the local dictionary to decompress compressed information of the compressed page.

19. The non-transitory processor-readable medium of claim 17, wherein the stored processor-executable software instructions are configured to cause a processor to perform operations such that decompressing the compressed page starting at a first end of the compressed page comprises decompressing the first decompression block.

20. The non-transitory processor-readable medium of claim 17, wherein the stored processor-executable software instructions are configured to cause a processor to perform operations further comprising:
determining decompression block boundaries of a plurality of decompression blocks of the compressed page; and
generating decompression block boundary metadata associated with the compressed page indicating the decompression block boundaries for each of the plurality of decompression blocks.

21. The non-transitory processor-readable medium of claim 17, wherein the stored processor-executable software instructions are configured to cause a processor to perform operations further comprising:
executing the first code instruction after terminating decompression of the compressed page; and
decompressing the second decompression block after terminating decompression of the compressed page.

22. The non-transitory processor-readable medium of claim 21, wherein the stored processor-executable software instructions are configured to cause a processor to perform operations such that:
decompressing the second decompression block after terminating decompression of the compressed page comprises decompressing the second decompression block after executing the first code instruction; or
decompressing the second decompression block after terminating decompression of the compressed page and executing the first code instruction after terminating decompression of the compressed page comprise executing the first code instruction and decompressing the second decompression block time sliced with each other.

23. The non-transitory processor-readable medium of claim 21, wherein the stored processor-executable software instructions are configured to cause a processor to perform operations further comprising:
scheduling executing the first code instruction on a first processor core;
scheduling decompressing the second decompression block on a second processor core; and
scheduling executing the first code instruction and decompressing the second decompression block to execute in parallel.

24. A computing device, comprising:
means for receiving a memory access request for retrieving a first code instruction of a plurality of code instructions of a page from a memory device;
means for determining a first decompression block of a compressed page containing the first code instruction in response to receiving the memory access request;
means for substituting a second decompression block of the compressed page with an exception code in response to receiving the memory access request;
means for decompressing the compressed page starting at a first end of the compressed page in response to receiving the memory access request; and
means for terminating decompression of the compressed page in response to completing decompression of the first decompression block.

25. The computing device of claim 24, further comprising:
means for building a local dictionary of patterns of compressed information of the compressed page related to decompressed information resulting from decompressing the compressed page; and
means for using the local dictionary to decompress compressed information of the compressed page.

26. The computing device of claim 24, wherein means for decompressing the compressed page starting at a first end of the compressed page comprises means for decompressing the first decompression block.

27. The computing device of claim 24, further comprising:
means for determining decompression block boundaries of a plurality of decompression blocks of the compressed page; and
means for generating decompression block boundary metadata associated with the compressed page indicating the decompression block boundaries for each of the plurality of decompression blocks.

28. The computing device of claim 24, further comprising:
means for executing the first code instruction after terminating decompression of the compressed page; and
means for decompressing the second decompression block after terminating decompression of the compressed page.

29. The computing device of claim 28, wherein means for decompressing the second decompression block after terminating decompression of the compressed page comprises means for decompressing the second decompression block after executing the first code instruction.

30. The computing device of claim 28, further comprising:
  means for scheduling executing the first code instruction on a first processor core;
  means for scheduling decompressing the second decompression block on a second processor core; and
  means for scheduling executing the first code instruction and decompressing the second decompression block to execute in parallel.

* * * * *